(12) United States Patent
Langhammer (10) Patent No.: US 7,228,531 B1
(45) Date of Patent: Jun. 5, 2007

(54) METHODS AND APPARATUS FOR OPTIMIZING A PROCESSOR CORE ON A PROGRAMMABLE CHIP

(75) Inventor: Martin Langhammer, Salisbury (GB)

(73) Assignee: Altera Corporation, San Jose, CA (US)

( * ) Notice: Subject to any disclaimer, the term of this patent is extended or adjusted under 35 U.S.C. 154(b) by 677 days.

(21) Appl. No.: 10/357,749

(22) Filed: Feb. 3, 2003

(51) Int. Cl.
*G06F 9/45* (2006.01)
(52) U.S. Cl. .................... 717/146; 717/151; 717/153
(58) Field of Classification Search ......... 717/124–146
See application file for complete search history.

(56) References Cited

U.S. PATENT DOCUMENTS

| | | | | |
|---|---|---|---|---|
| 5,175,856 | A * | 12/1992 | Van Dyke et al. .......... | 717/151 |
| 6,072,951 | A * | 6/2000 | Donovan et al. ........... | 717/158 |
| 6,308,323 | B1 * | 10/2001 | Douniwa ................... | 717/154 |
| 6,477,683 | B1 | 11/2002 | Killian et al. | |
| 6,772,413 | B2 * | 8/2004 | Kuznetsov ................. | 717/136 |
| 7,036,106 | B1 * | 4/2006 | Wang et al. ................ | 716/18 |
| 2002/0166112 | A1 * | 11/2002 | Martin et al. .............. | 717/124 |

OTHER PUBLICATIONS

U.S. Appl. No. 90/006,620, filed May 5, 2003, Killian et al.
Celoxica: cutting a Long story SHORT II, Celoxica announces DK1.1 for rapid hardware design.

* cited by examiner

*Primary Examiner*—Chuck Kendall
(74) *Attorney, Agent, or Firm*—Beyer Weaver LLP (57) ABSTRACT

Methods and apparatus are provided for efficiently implementing a customizable processor core on a programmable chip. Source code provided in a high level language is compiled into intermediate code. The optimizer uses the intermediate code and user parameters to define aspects of the processor architecture. The output is used to generate a model that provides profiling information for additional optimization.

29 Claims, 8 Drawing Sheets

METHODS AND APPARATUS FOR OPTIMIZING A PROCESSOR CORE ON A PROGRAMMABLE CHIP

BACKGROUND OF THE INVENTION

1. Field of the Invention

The present invention relates to implementing processor cores on programmable chips. More specifically, the present invention relates to methods and apparatus for enabling the efficient and optimized implementation of processor cores generated from source code.

2. Description of the Prior Art

A number of benefits have spurred efforts towards developing programmable chips having both logic elements and a processor core. In one example, integrating processor cores with logic elements on a single programmable chip allows efficient and effective processing using a variety of different logic mechanisms and functions. In one example, programmable chips are provided with not only logic elements and memory, but with processor cores and other components as well. Integrating processor cores and other components onto a programmable chip allow designers to more efficiently implement descriptions on programmable devices by allowing some functions to be performed by a processor core and other functions to be performed using logic elements.

Some mechanisms for implementing a processor core entail using a general purpose programming language or high level language. In one example, code written in a general purpose programming language such as C or C++ is converted into a hardware descriptor language (HDL) file using a tool such as the DK1 Design Suite available from Celoxica Corporation of Abingdon, United Kingdom. The HDL file can then be synthesized and implemented on a programmable chip such as a programmable logic device (PLD) or a field programmable gate array (FPGA). Some available synthesis tools are Leonardo Spectrum, available from Mentor Graphics Corporation of Wilsonville, Oreg. and Synplify available from Synplicity Corporation of Sunnyvale, Calif.

However, mechanisms for efficiently optimizing processor cores from a high level language on programmable devices are limited. It is therefore desirable to provide improved methods and apparatus for optimizing implementation of processor cores on programmable chips.

SUMMARY OF THE INVENTION

Methods and apparatus are provided for efficiently implementing a customizable processor core on a programmable chip. Source code provided in a high level language is compiled into intermediate code. The optimizer uses the intermediate code and user parameters to define aspects of the processor architecture. The output is used to generate a model that provides profiling information for additional optimization.

In one embodiment, a method for optimizing a processor core is provided. Intermediate code is identified. The intermediate code is compiled from source code for implementing a processor core on a programmable chip. An optimal instruction set for implementing the instructions associated with the intermediate code is identified. Identifying the optimal instruction set comprises selecting a set of instructions from a library of possible instructions that can be supported by the processor core. The optimal instruction set is implemented as the supported instruction set on the processor core.

In another embodiment, a programmable chip is provided. The programmable chip includes logic elements, memory, and processor elements. The logic elements are configurable to perform logic operations. Memory is associated with the logic elements. The processor elements are configured to support an optimal instruction set for implementing the instructions associated with one or more applications for the programmable chip. The optimal instruction set is identified by having an optimizer select a subset of instructions from the library of possible instructions that can be supported by the processor elements implemented as a processor core.

These and other features and advantages of the present invention will be presented in more detail in the following specification of the invention and the accompanying figures, which illustrate by way of example the principles of the invention.

BRIEF DESCRIPTION OF THE DRAWINGS

The invention may best be understood by reference to the following description taken in conjunction with the accompanying drawings, which illustrate specific embodiments of the present invention.

DETAILED DESCRIPTION OF SPECIFIC EMBODIMENTS

Reference will now be made in detail to some specific embodiments of the invention including the best modes contemplated by the inventors for carrying out the invention. Examples of these specific embodiments are illustrated in the accompanying drawings. While the invention is described in conjunction with these specific embodiments, it will be understood that it is not intended to limit the invention to the described embodiments. On the contrary, it is intended to cover alternatives, modifications, and equivalents as may be included within the spirit and scope of the invention as defined by the appended claims. For example, the techniques of the present invention will be described in the context of customizable processor architectures on a programmable chip. However, it should be noted that the techniques of the present invention can be applied to a variety of programmable chips. In the following description, numerous specific details are set forth in order to provide a thorough understanding of the present invention. The present invention may be practiced without some or all of these specific details. In other instances, well known process operations have not been described in detail in order not to unnecessarily obscure the present invention.

Conventional programmable chips include logic that can be customized for specific applications based on the needs of a particular user. Examples of programmable chips include programmable logic devices (PLDs) and field programmable gate arrays (FPGAs). Programmable chips offer advantages over more specialized application-specific integrated circuits (ASICs), such as significant cost savings in non-mass market applications. ASICs are custom-designed integrated circuits for specific usages. Because ASICs are custom-designed, they are often faster compared to programmable chips. However, the process of designing, verifying, fabricating, and testing ASICs is time-consuming and expensive. Any flaw uncovering on a particular ASIC after fabrication is complete requires a vast amount of time and expense to correct. Furthermore, ASICs are not programmable. An ASIC fabricated for specific digital signal processing (DSP) applications can not be reconfigured if the specific applications change.

Programmable chip implementations are sometimes slower than comparable ASIC implementations because the logic programmed onto a programmable chip is generally not optimized as well as customized logic on an ASIC. Consequently, ASICs have often been used in mass-market as well as performance sensitive applications. The desire to increase programmable chip performance has led to the integration of specialized resources along with logic elements on a programmable chip. In one particular example, resources such as processor cores have been provided along with logic elements on a single programmable chip.

Commonly used functions that can take advantage of processor cores include finite impulse response (FIR) filters and fast Fourier transform (FFT) functions. Many of these functions frequently use the multiplier as a fundamental building block and specialized operations such as multiply-add and multiply-accumulate as supplemented building blocks. Although operations such as multiply, multiply-add, and multiply-accumulate can be configured using logic elements, the speed and efficiency of the configuration may not be optimal. Consequently, it is beneficial to provide processor elements along with logic elements to allow more efficient implementation of various functions on a programmable chip and to allow the use of programmable chips in more performance sensitive applications. An processor on a programmable chip is referred to herein as a processor core while a piece of a processor or a component of the processor is referred to herein as a processor element or component.

Although having a dedicated, full-featured processor core on a programmable chip may be beneficial in some situations, there are also many situations where only certain features or functions of the processor core are needed. In many cases, much of the full-featured processor core may be essential unused and therefore wasted. In some instances, to get to the portions of the full-featured processor core that are needed, it may be necessary to route signals through otherwise unused portions of the programmable chip processor core. Routing signals through unused portions results in signal delay. The benefits of a specially configured processor core supporting only needed features or functions has resulted in the development of programmable chips with dedicated processor components. Any processor core that can be specially configured from processor components on a programmable chip is referred to herein as an application optimized processor core.

However, techniques for implementing an application optimized processor core are limited. In many examples, the programmable chips with application optimized processor cores are implemented by a designer preparing an architecture using a Hardware Description Language (HDL). However, using HDL may not be a very efficient or effective way of optimizing an application optimized programmable chip. Consequently, the techniques of the present invention provide mechanisms for optimizing programmable chips with application optimized programmable chips. In one example, a designer provides a description for the target implementation using a high level language such as C, C++, Java, or Pascal conventionally used by software engineers. The high level language includes mechanisms for implementing function calls either in hardware or in software. The high level language description is compiled into a generic sequential flow by parsing, building a symbol table, and generating a generic sequential flow using typical compiler techniques. Any intermediate code generated from a high level language that is later optimized and subsequently assembled for implementation on a programmable chip is referred to herein as a generic sequential flow.

The techniques of the present invention reocgnize that typical high level language descriptions do not have to use the entire instruction set supported by many processor cores. The techniques of the present invention provide that an optimal instruction set be selected from a library of possible instructions. The application optimized programmable chip is then implemented specifically to support the optimal instruction set. In many conventional implementations, a processor core is a Reduced Instruction Set (RISC) processor core that supports a predetermined set number of instructions. Although some of the instructions may not be used or may not be optimal for a specific application, the instructions are provided nonetheless. The techniques of the present invention also allow for selection of an optimized instruction set as well as customizing the number of operands and the forwarding level.

According to various embodiments, the techniques of the present invention allow for the efficient implementation of a description on an application optimized processor core associated with a programmable chip.

Figure 1:
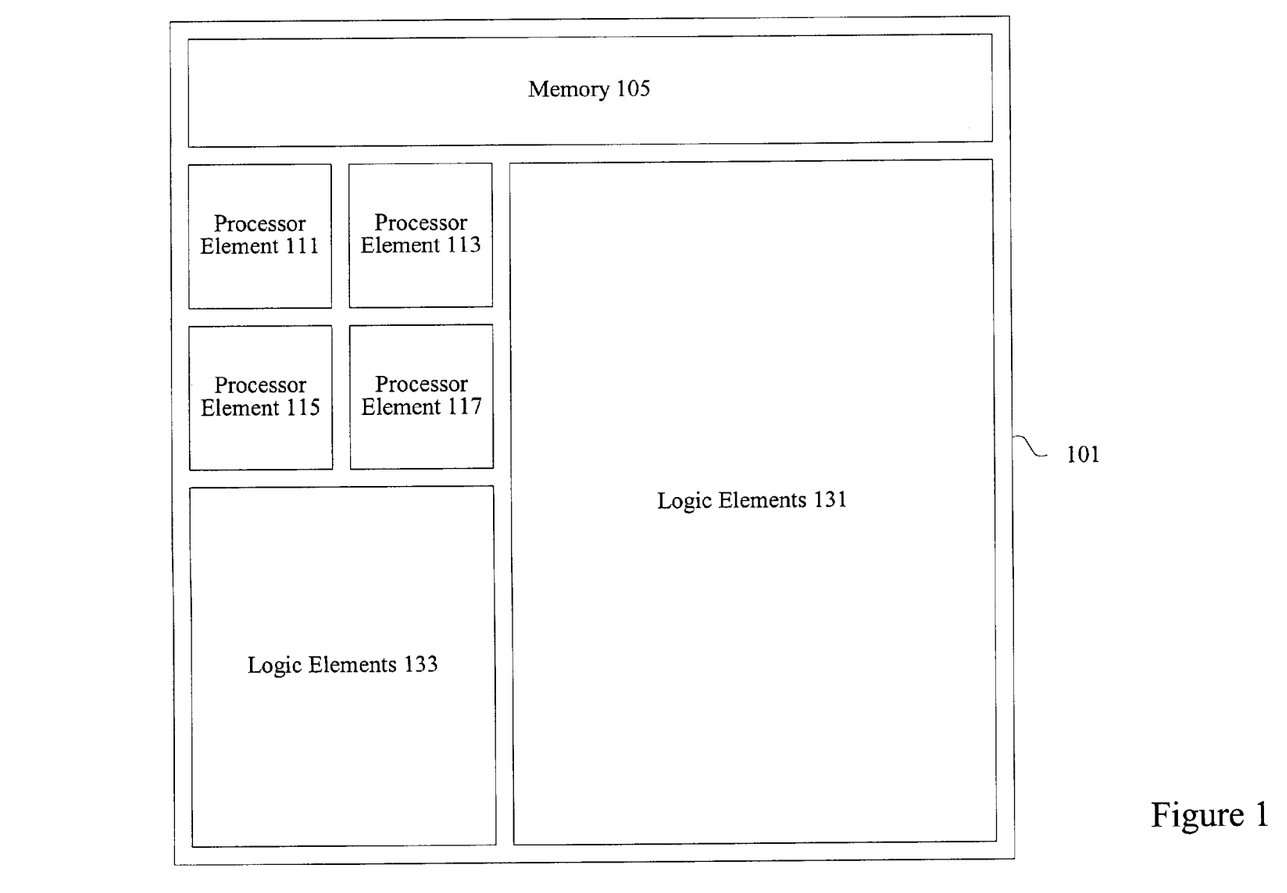
FIG. 1 is a diagrammatic representation showing a device that can be the target of the techniques of the present invention.

FIG. 1 is a diagrammatic representation of a programmable chip that can be used with the techniques of the present invention. Any programmable chip containing different types of resources that can be interchangeably used in different allocations to implement that same logic blocks is referred to herein as a heterogeneous programmable chip. In one example, the heterogeneous programmable chip includes memory 105, logic elements 131 and 133, and processor elements 111, 113, 115, and 117. It should be noted that various components such as processor elements 111, 113, 115, and 117 are optional. The programmable chip does not need these elements incorporated. A variety of different components can be assembled to form a processor core. Instead of providing a generic processor core on a programmable chip, different components are provided to allow customization of the processor core.

In some examples, shifters and arithmetic logic units (ALUs) are provided as components that can be assembled. The shifters and ALUs can be parameterized to allow further customization of the processor core. For example, a processor core can include an 8-bit barrel shifter or a 4-bit alignment shifter. The 8-bit barrel shifter provides functionality for a larger number of possible processes, but a 4-bit barrel shifter may be more efficient for the processes it supports. If it can be determined what size shifter is needed for a particular application, a processor core can be optimized for that application. In many implementations, parameterizing a soft core entails building only the portion that will be used.

It should be noted that although the techniques of the present invention will be described in the context of processor elements and logic elements, a variety of resources may be available on a heterogeneous chip. For example, some other resources include phase locked loops (PLLs) and multiplexers (MUXes). Logic elements 131 typically can be implemented using components such as antifuses, static RAM, and EPROMS. Any mechanism in a programmable chip that performs an operation on a given number of input lines to provide one or more outputs based on information programmed is herein referred to as a logic element. Some logic elements are implemented as combinations of look up tables and switches for performing Boolean operations on input lines. In one example, a logic element includes a 16-bit SRAM lookup table (LUT) that can implement an arbitrary 4-input logic function, circuitry that forms a fast carry chain and a fast cascade chain, a register and preset/reset logic for the register.

According to various embodiments, each processor element includes multiplier blocks and adder/output blocks. The multiplier block includes input registers, a multiplier, and a pipeline register for pipelining multiply-accumulate and multiply-add/subtract functions.

Figure 2:
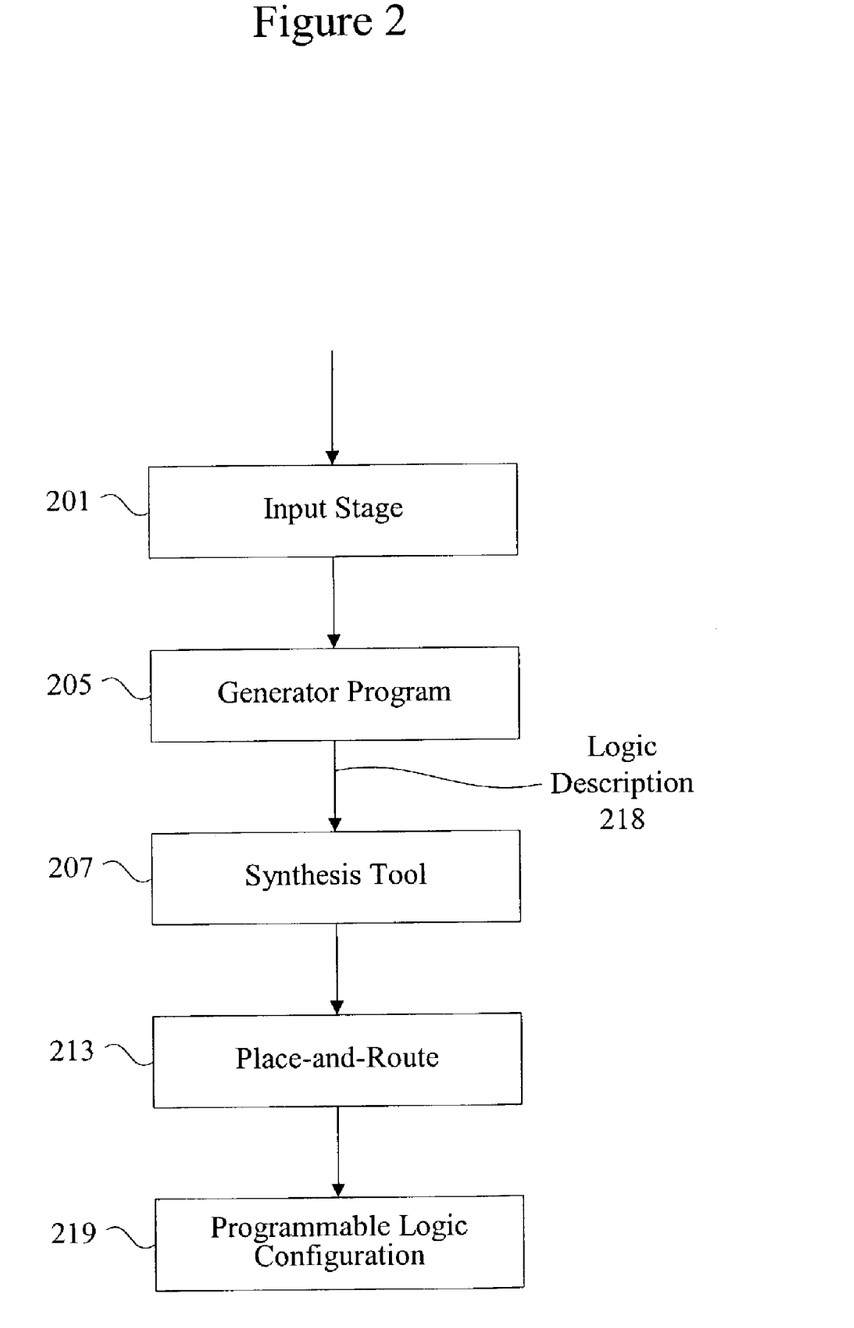
FIG. 2 is a diagrammatic representation showing the programming of the target device.

FIG. 2 is a diagrammatic representation of one example of the various programs, tools, and stages that are commonly used to implement a programmable chip. An input stage 201 receives selection information typically from a user for logic such as a processor as well as other components to be implemented on a programmable chip. A generator program 205 creates a logic description of the FIR filter and the FFT algorithm based on user specifications and provides the logic description of the FIR filter and FFT algorithm along with other customized logic to any of a variety of synthesis tools, place and route programs, and programmable logic configuration tools to allow a logic description to be downloaded onto the programmable chip.

More specifically, an input stage 201 typically allows selection and parameterization of components to be used with customized logic. In some examples, components provided to an input stage include intellectual property functions, megafunctions, and intellectual property cores. The input stage 201 may be a graphical user interface using wizards for allowing efficient or convenient entry of information. The input stage may also be a text interface or a program reading a data file such as a spreadsheet, database table, or schematic to acquire selection information. The input stage 201 produces an output containing information about the various modules selected.

Intellectual property functions have conventionally encapsulated a single implementation for the specified function. Designers would have to select general processor cores to implement specific functions with logic elements. In some instances, a general processor core would have some configurable parameters. In one instance, an 8-bit processor versus a 16-bit processor could be selected based on the needs of the application and the availability of resources. However, conventional techniques for customizing and optimizing a processor core to fit the needs of a particular application are limited.

In typical implementations, the generator program 205 can identify the selections and generate a logic description with information for implementing the various modules. The generator program 205 can be a Perl script creating HDL files such as Verilog, Abel, VHDL, and AHDL files from the module information entered by a user. According to various embodiments, the generator program 205 also provides information to a synthesis tool 207 to allow HDL files to be automatically synthesized. In some examples, a logic description is provided directly by a designer. Some of the available synthesis tools are Leonardo Spectrum, available from Mentor Graphics Corporation of Wilsonville, Oreg. and Synplify available from Synplicity Corporation of Sunnyvale, Calif.

As will be appreciated by one of skill in the art, the input stage 201, generator program 205, and synthesis tool 207 can be separate programs. The interface between the separate programs can be a database file, a log, or simply messages transmitted between the programs. For example, instead of writing a file to storage, the input stage 201 can send messages directly to the generator program 205 to allow the generator program to create a logic description. Similarly, the generator program can provide information directly to the synthesis tool instead of writing HDL files. Similarly, input stage 201, generator program 205, and synthesis tool 207 can be integrated into a single program.

A user may select various modules and an integrated program can then take the user selections and output a logic description in the form of a synthesized netlist without intermediate files. Any mechanism for depicting the logic to be programmed onto a programmable chip is referred to herein as a logic description. According to various embodiments, a logic description is an HDL file such as a VHDL, Abel, AHDL, or Verilog file. A logic description may be in various stages of processing between the user selection of components and parameters to the final configuration of the programmable chip. According to other embodiments, a logic description is a synthesized netlist such as an Electronic Design Interchange Format Input File (EDF file). An EDF file is one example of a synthesized netlist file that can be output by the synthesis tool 207.

A synthesis tool 207 can take HDL files and output EDF files. Various synthesized netlist formats will be appreciated by one of skill in the art. The synthesized netlist file can be read by a place and route tool 213. A place and route tool typically locates logic cells onto specific logic elements of a target hardware device and connects wires between the inputs and outputs of the various logic elements in accordance with logic required to implement an electronic design. A programmable logic configuration stage 219 can take the output of the place and route tool to program the logic device with the user selected and parameterized modules. According to various embodiments, the place and route tool 213 and the programmable logic configuration stage 219 are provided in the Quartus Development Tool, available from Altera Corporation of San Jose, Calif. As will be appreciated by one of skill in the art, a variety of synthesis, place and route, and programmable logic configuration tools can be used to implement various techniques of the present invention.

As noted above, different stages and programs can be integrated in a variety of manners. According to one embodiment, the input stage 201, the generator program 205, the synthesis 207, the place and route tool 213, and the programmable logic configuration stage 219 are integrated into a single program. The various stages are automatically run and transparent to a user. The program can receive the user selected modules, generate an logic description depicting logic for implementing the various selected modules, and implement the programmable chip. As will be appreciated by one of skill in the art, HDL files and EDF files are mere examples of a logic description. Other file formats as well as internal program representations are other examples of a logic description. Internal program representations can be transitory data used by a program to provide information for implementing FIR filters and FFT algorithms on programmable chips.

Figure 3:
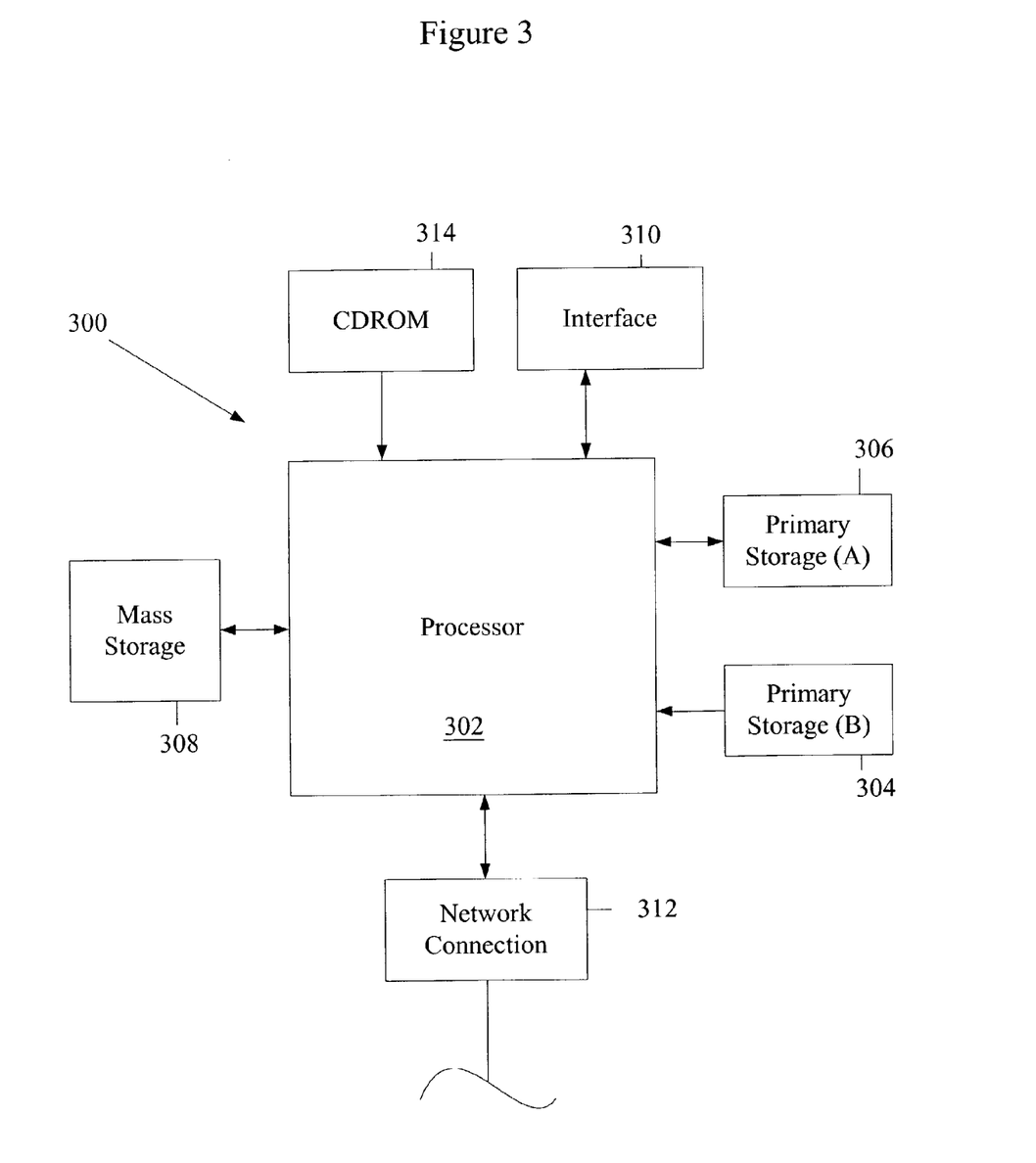
FIG. 3 is a diagrammatic representation of a system for configuring the target device.

FIG. 3 illustrates a typical computer system that can be used to implement a programmable chip in accordance with an embodiment of the present invention. The computer system 300 includes any number of processors 302 (also referred to as central processing units, or CPUs) that are coupled to storage devices including primary storage 306 (typically a random access memory, or "RAM"), primary storage 304 (typically a read only memory, or "ROM"). The processors 302 can be configured to receive selection information from a user to dynamically generate a logic description. As is well known in the art, primary storage 304 acts to transfer data and instructions uni-directionally to the CPU and primary storage 306 is used typically to transfer data and instructions in a bi-directional manner.

Both of these primary storage devices may include any suitable type of the computer-readable media described above. A mass storage device 308 is also coupled bi-directionally to CPU 302 and provides additional data storage capacity and may include any of the computer-readable media described above. The mass storage device 308 may be used to store programs, data and the like and is typically a secondary storage medium such as a hard disk that is slower than primary storage. The mass storage device 308 can be used to hold a library or database of prepackaged logic or intellectual property functions, as well as information on generating particular configurations. It will be appreciated that the information retained within the mass storage device 308, may, in appropriate cases, be incorporated in standard fashion as part of primary storage 306 as virtual memory. A specific mass storage device such as a CD-ROM 314 may also pass data uni-directionally to the CPU.

CPU 302 is also coupled to an interface 310 that includes one or more input/output devices such as such as video monitors, track balls, mice, keyboards, microphones, touch-sensitive displays, transducer card readers, magnetic or paper tape readers, tablets, styluses, voice or handwriting recognizers, or other well-known input devices such as, of course, other computers. Video monitors can be used to display wizards and subwizards to a user. Finally, CPU 302 optionally may be coupled to a computer or telecommunications network using a network connection as shown generally at 312. With such a network connection, it is contemplated that the CPU might receive information from the network, or might output information to the network in the course of performing the above-described method steps. It should be noted that the system 300 may also be associated with devices for transferring completed designs onto a programmable chip. The above-described devices and materials will be familiar to those of skill in the computer hardware and software arts.

The hardware elements described above may be configured (usually temporarily) to act as multiple software modules for performing the operations of this invention. For example, instructions for running a generator program, input stage (e.g., a wizard), and/or compiler may be stored on mass storage device 308 or 314 and executed on CPU 308 in conjunction with primary memory 306.

Although many of the components and processes are described above in the singular for convenience, it will be appreciated by one of skill in the art that multiple component and repeated processes can also be used to practice the techniques of the present invention.

Figure 4:
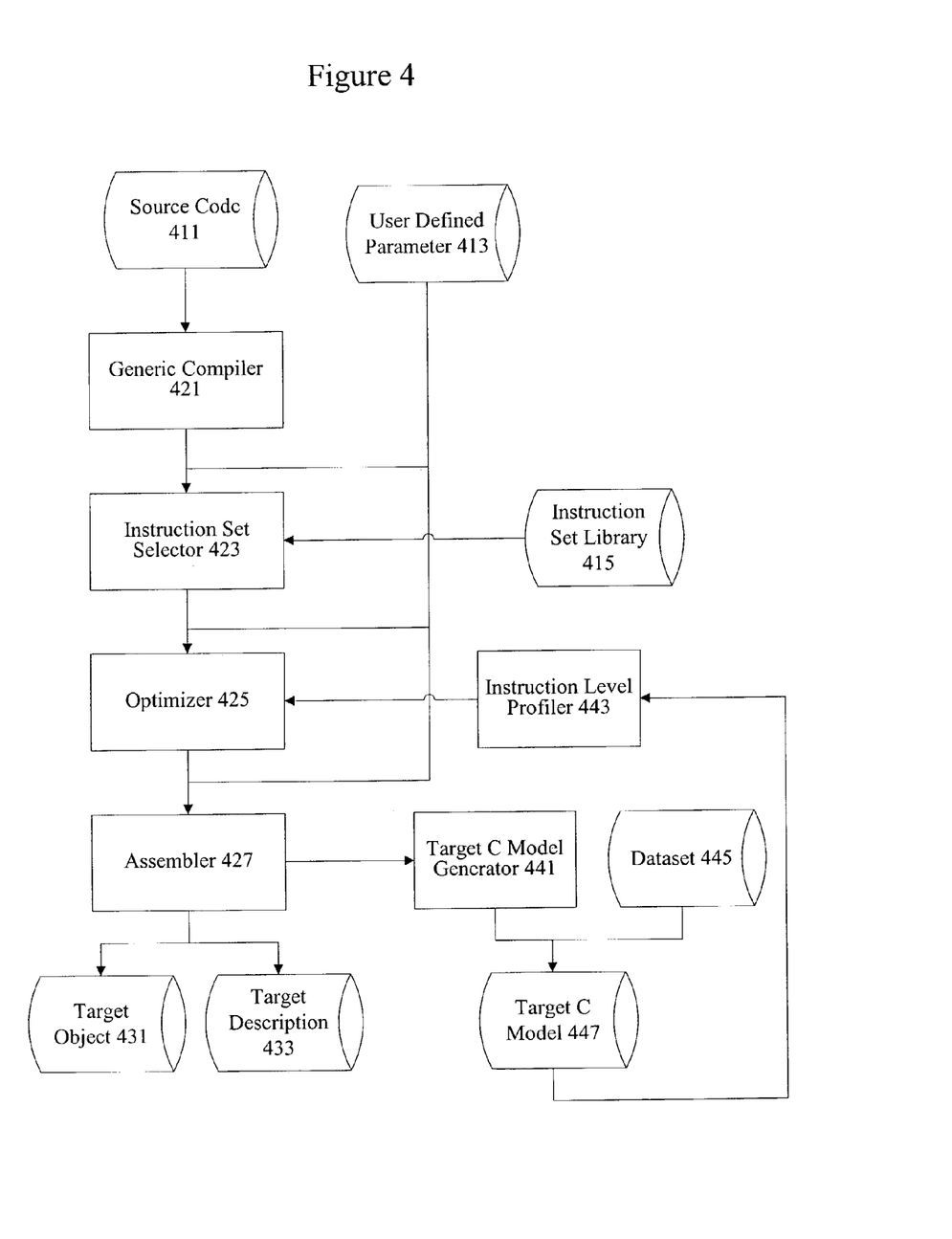
FIG. 4 is a diagrammatic representation showing a technique for generating a logic description using a high level programming language.

FIG. 4 is a diagrammatic representation showing one technique for generating a target object and a target description from source code. The techniques of the present invention perform pattern checking and optimizations controlled by designer configurable parameters. According to various embodiments, source code 411 written in a high level language is compiled into intermediate code. Any symbolic form depicting individual instructions that a computer understands is referred to herein as intermediate code. In one example, intermediate code is output after source code is compiled by a compiler 421. According to various embodiments, the techniques of the present invention provide for the analysis of the intermediate code to optimize the processor architecture to execute the selected instructions and data types as efficiently as possible and/or changing the generated code to achieve a desired size/speed tradeoff. The individual steps for compiling source code include parsing, building a symbol table, and generating intermediate code.

It should be noted that in many conventional implementations, processor cores have a supported instruction set that is predetermined. For example, RISC processor cores typically include approximately 50 supported instructions. If additional instructions are needed, the additional instructions are converted into one of the 50 supported instructions. If some of the 50 supported instructions are not needed by a particular application, they are nonetheless supported. A processor core with a fixed instruction set leads to inefficiency since the instruction set supported is not ideal or configured for particular applications. The instruction set selector 423 of the present application receives the intermediate code provided by the generic compiler 421 and uses user-defined parameters 413 to determine the optimal instruction set needed to support the intermediate code.

For example, if some instruction such as multiplication and shifting instructions can be supported as multiple cycle instructions using loops of adds, subtracts, and bit shifts, instructions are substituted. According to various embodiments, the loops will be subroutines containing unrolled loops. Designer parameters such as the whether multiple cycle multiplies and multiple cycle shifts are preferred over single cycle multiplies and single cycle shift are provided. Designer parameters are used to determine the optimal instruction set. Typically, the more multiple cycle multiplies and the more multiple cycle shifts used, the smaller the optimal instruction set.

The instructions can be selected from an instruction set library 415 containing a large number of possible instructions. Hardware calls are also supported by the instruction set. Any function that this to be implemented on hardware as opposed to being interpreted as a software call is referred to herein as a custom instruction. Code is written to pass data to the custom instruction and to receive it from the custom instruction. According to various embodiments, custom functions are identified as any function call starting with the phrase "custom." In some examples, custom instructions are provided to instruction set selector 423 as prepared custom instructions in VHDL Design File (VHD) or an AHDL Text Design File (TDF) format.

According to various embodiments, a VHD file is an ASCII text file created with the Quartus II Text Editor available from Altera Corporation of San Jose, Calif. or another standard text editor. A VHD file contains design logic that is defined with VHDL. The VHD file can incorporate primitives, megafunctions, and macrofunctions as well as other user defined components. A single VHDL Design File can be used to define all logic in a project, or can be incorporated at any hierarchy level in a hierarchical project.

The optimizer 425 receives the output of the instruction set selector 423. According to various embodiments, the optimizer 425 uses peephole optimization to optimize a few lines of instructions at a time. In some embodiments, the input code at this point is still generic or in a form resembling the output of a conventional compiler, and the number of operands for various instructions can be changed. The optimizer 425 uses user defined parameters 413 to determine the optimal number of operands each instruction should support. In one example, the optimizer determines whether the instructions should support 2 or 3 operands, although other numbers of operands can be supported.

The assembler 427 takes the output of the optimizer 425 and uses the forwarding level provided by the user defined parameters 413 to set the level of forwarding or bypassing implemented to prevent pipeline stalls. The forwarding level can be set to 0, 1, or 2 levels, e.g., and provides a size/speed tradeoff. The output of the assembler is both a target object 431 to be implemented in software for interacting with the processor core and a target description 433 to be implemented as part of the processor core. According to various embodiments, the target description 433 includes program and data internal bus widths. The data bus width also defines the width of an external data bus.

The external data bus is used to load and unload data. The target description also specifies the hardware instruction support such as multiplies and shifts to be implemented, as well as the instruction set format, such as the number of operands and the instructions themselves. Some of the input user switches, such as forwarding, are passed to the target description unfiltered. The names and numbers of constant instructions are also provided in the target description. The names of the custom instructions are called by the HDL description during hardware compilation, e.g. customone.tdf. According to various embodiments, the optimizer has several distinct steps including selecting the number of operands per instruction and re-optimizing the code afterwards.

Figure 5:
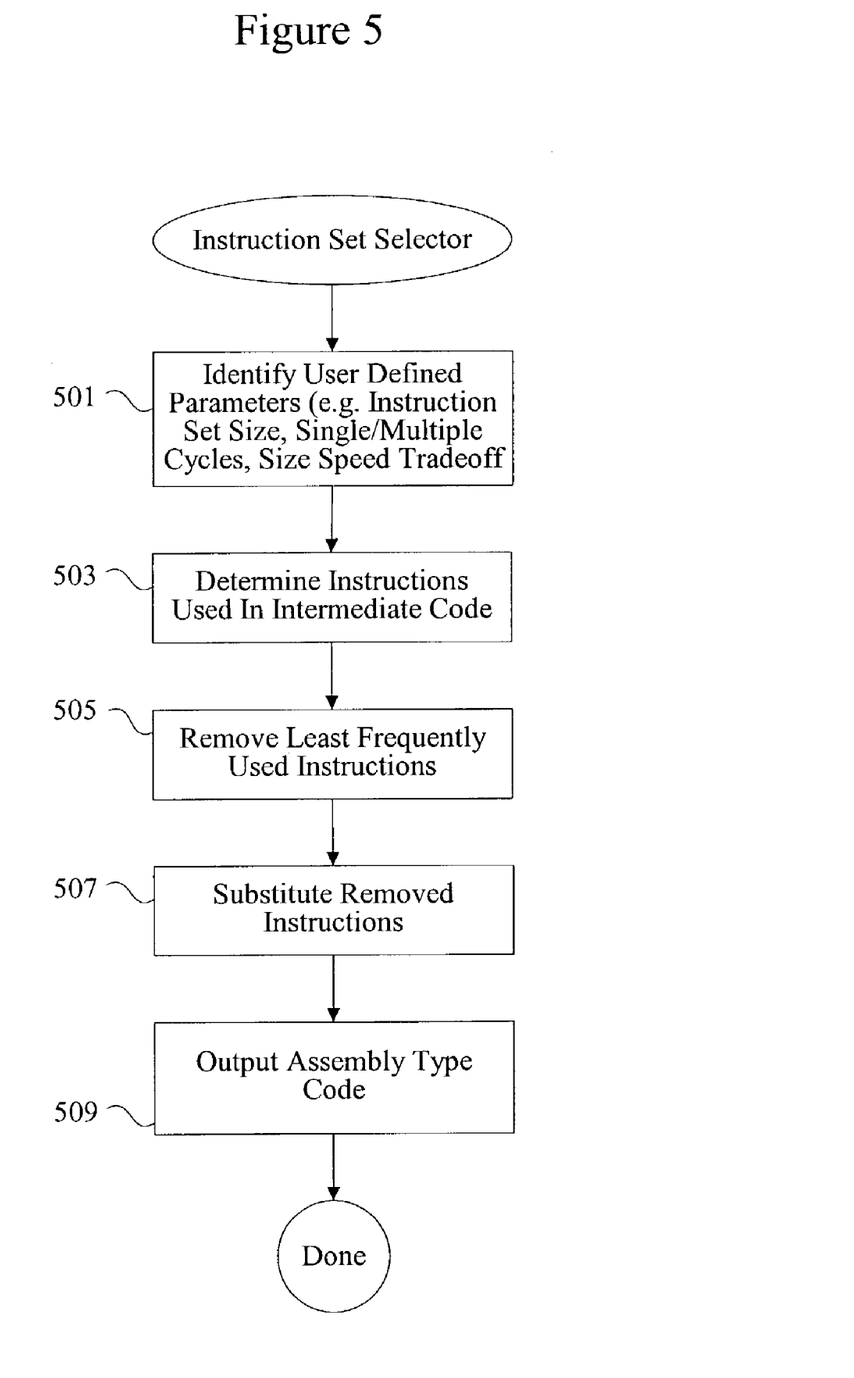
FIG. 5 is a flow process diagram showing a technique for selecting an instruction set.

FIG. 5 is a flow process diagram showing an exemplary technique for selecting an instruction set. At 501, user defined parameters are identified. User parameters can be provided in a variety of different manners such as parameter files, databases, and designer inputs. Possible user defined parameters include desired instruction set size, preference for single or multiple cycles for various instructions, and information for setting a size/speed tradeoff. In one example, a designer can elect to configure a processor core with a large number of supported single cycle instructions that can be performed quickly while possibly using a large number of resources. At 503, the instructions used in the intermediate code are determined. At 505, the least frequently used instructions are removed. In one example, a data structure is used to track the frequency in occurrence of each instruction. For example, intermediate code may specify that the following instructions be provided by a processor core.

branch not equal:
      bne $s3, $s2, Loop
      # go to Loop if the value of $s3 is not equal to the value of $s2
    set less than:
      slt $t0, $s3, $s4
      # register $t0 is set to 1 if $s3 is less than $s4, else register $t0 is set to 0
    branch less than:
      blt $s3, $s2, Loop
      # go to Loop if the value of $s3 is less than the value of $s2

In some implementations, all three of the above instructions branch not equal, set less than, and branch less than, amongst others, may be included in an instruction set supported by the processor core. However, in other implementations, branch less than may not be included because it is infrequently used in the intermediate code. Including the branch less than instruction could decrease the efficiency of the processor core or use valuable processor core resources. If the user parameters specify a smaller supported instruction set, for example, the branch less than instruction could be replaced with other instructions. Instead of using the branch less than instruction, the same function can be performed using substitute instructions at 507.

blt $s0, $s1, Loop
    # go to Loop if the value of #s0 is less than the value of $s1

In one example, the above instruction can be replaced using the following pair of instructions:

slt $t0, $s0, $s1
    # $t0 gets 1 if $s0<$s1
    bne $t0, $zero, Loop
    # go to Loop if $t0 does not equal 0

Consequently, there is a branch to Loop if $s0 is less than $s1. In another example, a move instruction may be represented as follows:

move $t0, $t1
    # move the contents of $t1 into $t0

The above instruction can be replaced using the following instruction:

add $t0, $zero, $t1
    # add the contents of $t1 to 0 and place the result in $t0

Alternatively, the optimizer or instruction selector can look for patterns or combinations of instructions. When the instruction selector finds a recurring pattern, for example, it can select some rarely used "super-instructions" from the list of instructions. "Super-instructions" may be very large in terms of logic, but if the patterns are called often enough, it may be worth using them. The instruction selector can also try to build a custom instruction by combining the logic descriptions of several simple instructions that occur in a pattern often enough.

The optimizer of the present invention includes capabilities beyond those provided in typical optimizers. Typical optimizers select instruction formats to fit an available instruction set. The techniques of the present invention, however, provide an optimizer that can change the processor based on a size/speed tradeoff and/or the instruction set based on a size/speed tradeoff. In some instances, the substitutions are automatic. For example, move instructions may always be replaced by add by zero instructions.

However, other substitutions may involve tradeoffs. In one example, reducing the size of a processor core supported instruction set increases the number of cycles needed to perform certain operations. The techniques of the present invention allow a designer to customize a processor core to most efficiently support the instruction set that the intermediate code uses. In one example, frequently used instructions are retained as single cycle instructions while infrequently used instructions are replaced with more frequently used single cycle instructions. At 509, assembly type code is provided to an assembler. Any format readable by a conventional assembler is referred to herein as assembly code. It should be noted that although a particular format is used to describe the instructions herein, there are a wide variety of formats that can be used to represent operations.

Figure 6:
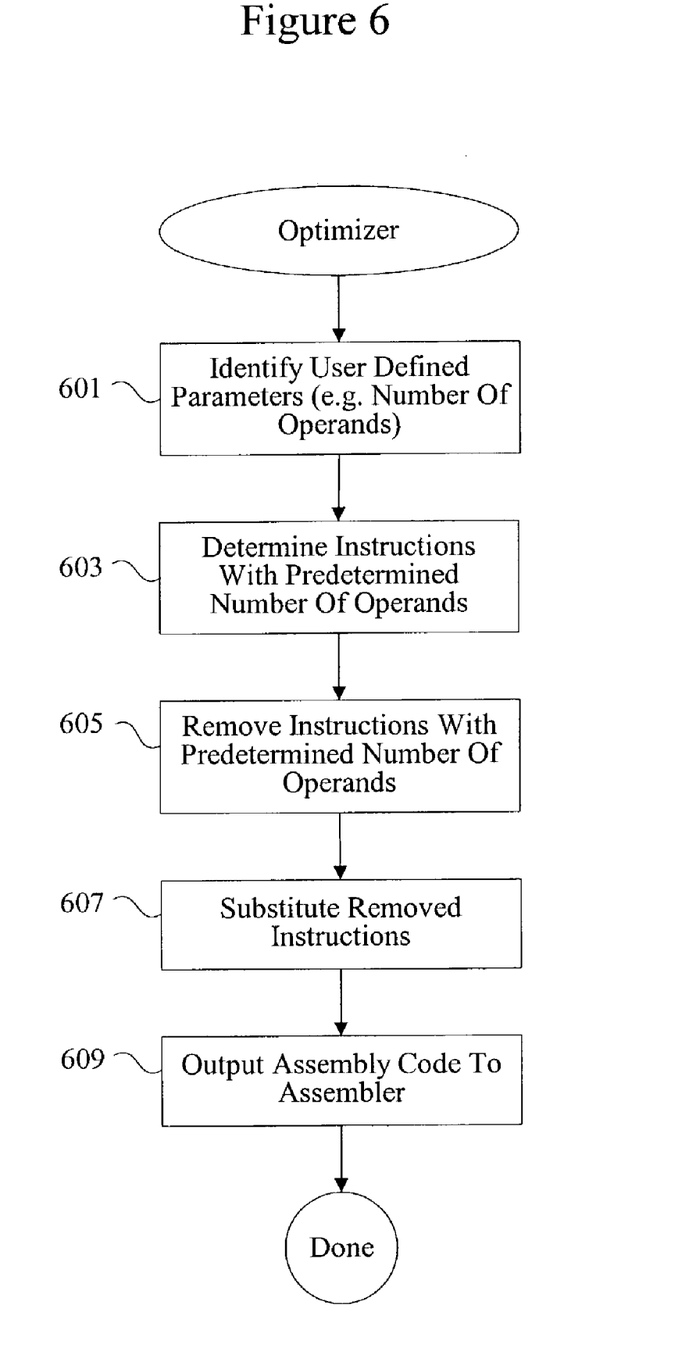
FIG. 6 is a flow process diagram showing a technique for optimizing intermediate code.

FIG. 6 is a flow process diagram showing an optimizer. According to various embodiments, the optimizer is used to configure the number of operands in various instructions as well as parameterize various components in a system. In one example, the optimizer converts three operands instructions into two operands instructions. It also can take feedback information and parameterize various processor elements such as bit shifters. At 601, user-defined parameters are identified. In one example, user-defined parameters include the number of operands for various instructions. At 603, instructions with the predetermined number of operands are determined. At 605, is instructions with the predetermined number of operands are removed and substituted at 607.

In one example, instructions such as the following multiple operand instruction can be replaced using two operand instructions.

add3 $s1, $s3, $s4, $s5
add the contents of $s3, $s4, and $s5 and place the result in $s1
add $s2, $s3, $s4
add $s1, $s2, $s5
add the contents of $s3 and $s4 and place the result in $s2
add $s2 and $s5 and place the result in $s1

In another example, two operand instructions can be replaced using multiple operands instructions.

| lw $s1, 100($s5) | $s1 = Memory[$s5 + 100] |
| lw $s2, 200($s5) | $s2 = Memory[$s5 + 200] |
| lw $s3, 300($s5) | $s3 = Memory[$s5 + 300] |
| lw $s4, 400($s5) | $s4 = Memory[$s5 + 400] | copy memory contents of $s5 to registers $s1–$s4

The above instructions can be replaced with the following instruction:

Lm4 $s1, $s2, $s3, $s4, 100($s5), 200($s5), 300($s5), 400($s5)
copy memory contents of $s5 to registers $s1–$s4

The intermediate code optimized based on the number of operands identified by user parameters is passed to an assembler. According to various embodiments, the intermediate code includes portions that will be assembled as a target object to be run on a processor core and portions to be assembled as a target description to be implemented on the programmable chip. In some examples, the target object portions correspond to the software portions not identified as custom while the target description portions are identified as custom instructions and associated with information provided in formats such as the VHD or TDF formats.

Figure 7:
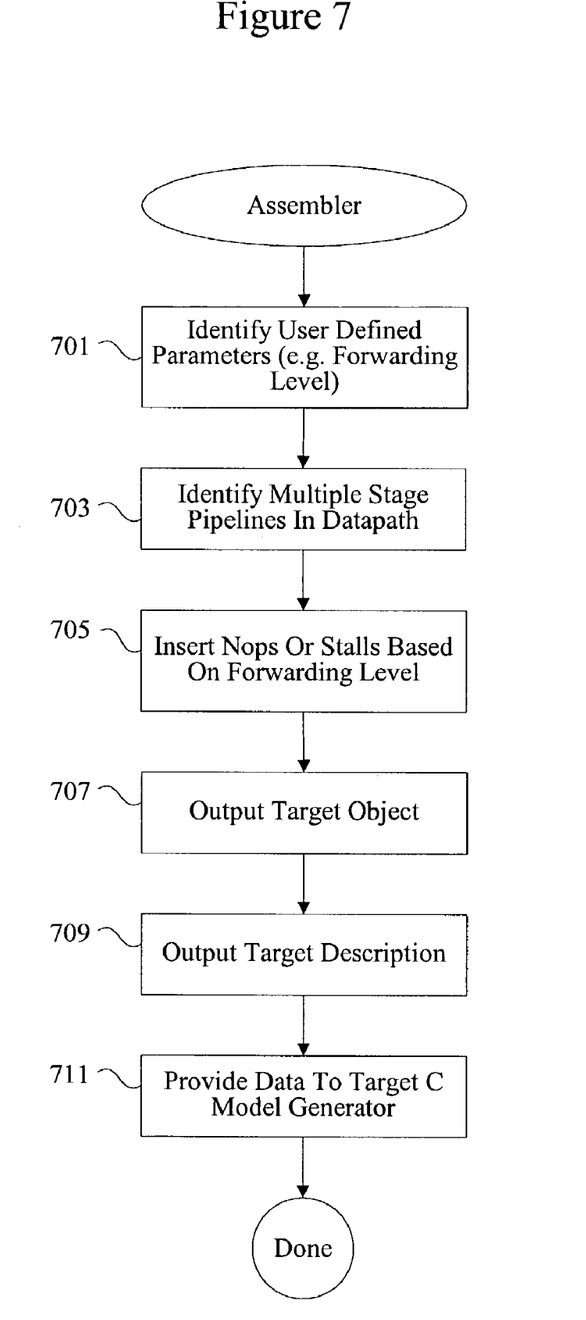
FIG. 7 is a flow process diagram showing assembler techniques.

FIG. 7 is a flow process diagram showing exemplary processes of an assembler. At 701, user parameters such as forwarding level are identified. In systems using pipelining, there may be stalls in the pipeline when an instruction in a second pipeline depends on the result of a previous instruction in the first pipeline. For example, there may be an operation calling for an add instruction followed immediately in pipelined fashion by a subtraction instruction.

add $s0, $t0, $t1
add $t0 and $t1 and place the result in $s0
sub $t2, $s0, $t3
sub $s0 from $t3 and place the result in $t2

In a first stage, the add instruction would be fetched. In a second stage, the register values $t0 and $t1 associated with the add instruction would be read and the sub instruction would be fetched. In a third stage, the values $t0 and $t1 would be provided to an ALU while the register values $s0 and $t3 would be read. However, the register value $s0 is not yet available. The register value $s0 may not be available until after a memory data access in the fourth stage and a write register in the fifth stage associated with the add instruction. Consequently, there would be a pipeline stall, as the sub instruction is ready for the data in the third stage but the data is not written into the register until the fifth stage. In order to remedy the pipeline stall, bypassing or forwarding can be used. According to various embodiments, bypassing or forwarding entails directly routing the result of the ALU add instruction to the ALU sub instruction.

In this manner, the value to be written into register $s0 in the fifth stage would be available in the fourth stage for the sub instruction. Alternatively, the output of the memory data access could be provided to the ALU sub instruction in the fifth stage. Various levels or forwarding and bypassing can be used to prevent pipeline stalls. In one example, the higher the level of forwarding, the sooner the data becomes available for a subsequent pipelined instruction. However, having a higher level of forwarding may use more resources on a processor core. A lower level of forwarding may not allow data to be available as quickly, but the resources used on the processor core may be less.

The assembler takes user selected forwarding level information and identifies multiple stage pipelines at 703. At 705, nops or stalls paths are inserted based on forwarding level provided by a designer. According to various embodiments, additional instructions to waste cycles are inserted where there is not enough forwarding resource available to prevent a conflict. In some embodiments, a forwarding path is a connection between the output of a particular component and the input of another component through a multiplexer that selects an input based on whether forwarding should or should not be used. The assembler can then output a target object 707 specifying the software associated with the processor core and a target description specifying how the processor core should be implemented on the programmable chip.

Figure 8:
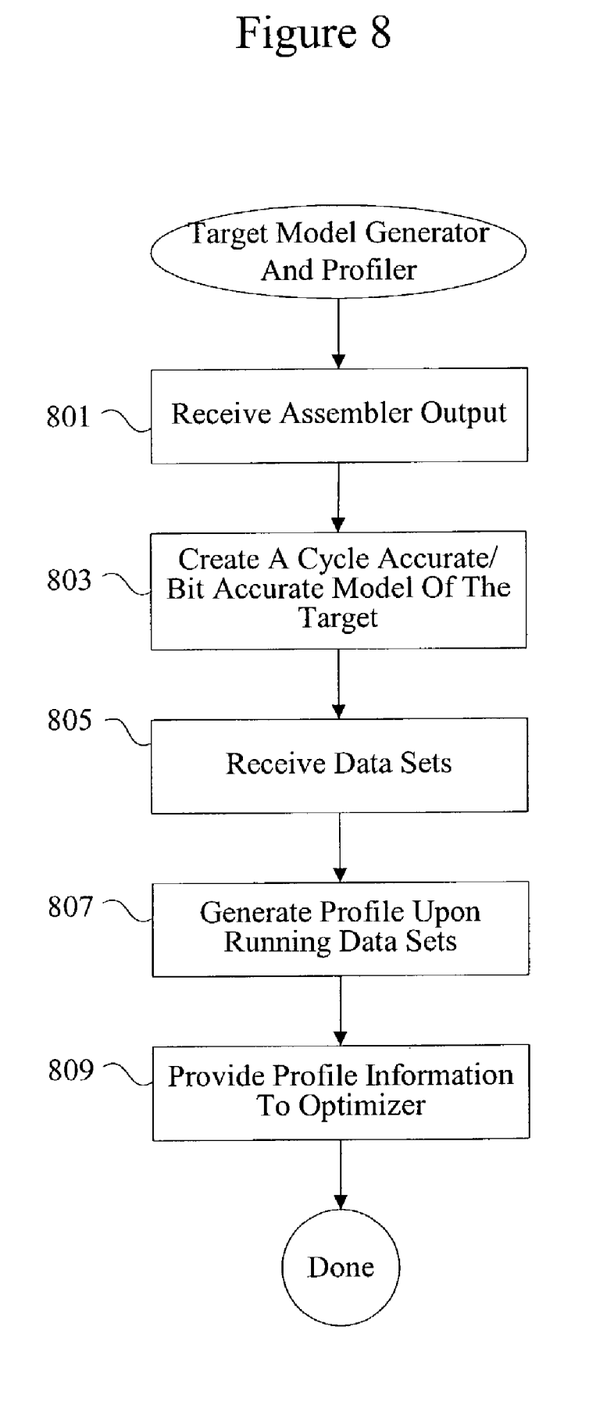
FIG. 8 is a flow process diagram showing a target model generator and profiler techniques.

FIG. 8 is a flow process diagram showing operations performed by a target model generator and an instruction level profiler. At 801, assembler output is received. Any mechanism that provides a bit accurate and cycle accurate simulation of the assembler output is referred to herein as a target model generator. In one example, the target model generator outputs a model to simulate a processor core to be implemented.

A data set is received at 805 and run on the target model at 805. The model is then profiled at 807. Profiling allows a determination of the amount of time and resources used by specific instructions. Any mechanism that performs analysis on instructions to determine time and resource usage levels is referred to herein as an instruction level profiler. In one example, profiling entails measuring the amount of time specific sections of code take to execute and tracking the instructions that are called. In addition, using a profiler enables improved program execution time by focusing optimizing efforts on the sections of code that consume the most resources or time to execute. One example of an instruction level profiler that performs complexity analysis is IPROF Portal Instruction Level Profiler available from the Institute for Integrated Circuits at the Munich University of Technology in Germany.

In one example, a 16-bit shifter is initially provided for Fast Fourier Transform operations. However, upon analyzing the instructions using various datasets, it may be determined that a 16-bit shifter is not needed. In this example, the 16-bit shifter is replaced using a 4-bit shifter. The instruction level profiler provides feedback to the optimizer at 809 and directs the optimizer to use a 4-bit shifter instead of a 16-bit shifter. According to various embodiments, the optimizer uses the feedback information to parameterize a shifter as a 4-bit shifter instead of as a 16-bit shifter during optimization. The optimizer output can then be provided again to an assembler 427 for generation of a target object and a target description or for generation of another target model. According to various embodiments, the profiler of the present invention is capable of determining the least run instructions and remove or replace the instructions by feeding back information to the optimizer. The optimizer can then generate a more streamlined instruction set optimized for the particular application. The profiler of the present invention can also be used to profile based on data dependencies, instead of just program dependencies, in situations where a soft processor is used.

It should be noted that although various aspects of the present invention have been described as distinct components, it is possible to implement the techniques of the present invention using different configurations. For example, the instruction set selector and the optimizer have been described as distinct component with different functionality. However, it will be appreciated that the optimizer and the instruction set selector may be integrated into an assembler or into a compiler itself. Alternatively, the instruction set selector and the optimizer may be configured as a single component.

While the invention has been particularly shown and described with reference to specific embodiments thereof, it will be understood by those skilled in the art that changes in the form and details of the disclosed embodiments may be made without departing from the spirit or scope of the invention. For example, various aspects described above may be implemented using firmware, software, or hardware. Moreover, aspects of the present invention may be employed with a variety of different file formats, languages, and communication protocols and should not be restricted to the ones mentioned above. Therefore, the scope of the invention should be determined with reference to the appended claims.

What is claimed is:

1. A method comprising:
    identifying intermediate code, wherein the intermediate code is compiled from source code for implementing a processor core on a programmable chip, wherein the processor core is customizable;
    identifying an instruction set for implementing the instructions associated with the intermediate code, wherein identifying the instruction set comprises selecting individual instructions from a library of possible instructions that can be supported by the processor core; and
    implementing the instruction set as the supported instruction set on the processor core, wherein one or more instructions from the library of possible instructions can not be used by the processor core implemented on the programmable chip.

2. The method of claim 1, wherein identifying the instruction set further comprises using instruction set parameters provided by a designer.

3. The method of claim 1, wherein instruction set parameters include parameters specifying the desired size of the optimal instruction set.

4. The method of claim 1, wherein instruction set parameters include parameters specifying whether instructions should preferably be multiple cycle or single cycle instructions.

5. The method of claim 1, further comprising optimizing the intermediate code by varying the number of operands associated with the instructions.

6. The method of claim 1, further comprising optimizing the intermediate code by replacing instructions infrequently used in the intermediate code with sequences of instructions more frequently used.

7. The method of claim 6, wherein the replaced infrequently used instructions are then not supported by the implemented processor core.

8. The method of claim 1, further comprising optimizing the intermediate code by replacing sequences of instructions with a single combined instruction.

9. The method of claim 8, wherein the single combined instruction is provided in the library of possible instructions.

10. The method of claim 5, further comprising passing the intermediate code to an assembler.

11. The method of claim 10, wherein the assembler determines the forwarding level for optimizing pipelined processing.

12. The method of claim 10, wherein the assembler outputs a target description and a target object, the target description identifying how to implement the programmable chip and the target object identifying how to use the programmable chip.

13. The method of claim 12, wherein the target description is provided in a hardware description language.

14. The method of claim 12, wherein the target description is VHDL.

15. The method of claim 5, wherein optimizing the intermediate code comprises receiving feedback information from an instruction level profiler.

16. The method of claim 5, wherein the instruction level profiler takes the assembler outputs, generates a model, and runs data sets on the model.

17. The method of claim 1, wherein generating the intermediate code comprises parsing the source code and building a symbol table.

18. A programmable chip, comprising:
    logic elements configurable to perform logic operations;
    memory associated with the logic elements; and
    processor elements configurable to support an instruction set for implementing the instructions associated with one or more applications for the programmable chip, wherein the instruction set is provided by having an optimizer select individual instructions from a library of instructions that can be supported by the processor elements implemented as a processor core, wherein one or more instructions from the library of possible instructions can not be used by the processor core implemented on the programmable chip.

19. The programmable chip of claim 18, wherein the processor elements can be selectively combined to operate as the processor core.

20. The programmable chip of claim 19, wherein processor elements are selectively combined to operate as the processor core based on the identified optimal instruction set.

21. The programmable chip of claim 20, wherein the processor core is a parameterizable processor core on a programmable logic device.

22. The programmable chip of claim 21, wherein the processor core is a soft processor core on a programmable logic device.

23. The programmable chip of claim 18, wherein the optimizer is configured to customize the processor core architecture to meet a size versus speed tradeoff.

24. The programmable chip of claim 18, wherein the optimizer is configured to customize the instruction set to meet a size versus speed tradeoff.

25. The programmable chip of claim 24, wherein customizing the instruction set comprises selecting the number of operands per instruction.

26. The programmable chip of claim 25, wherein customizing the instruction set comprises determining patterns of instructions and combining instructions into a single instruction.

27. The programmable chip of claim 26, wherein customizing the instruction set comprises replacing infrequently used instructions with more frequently used instructions.

28. A system comprising:
   means for identifying intermediate code, wherein the intermediate code is compiled from source code for implementing a processor core on a programmable chip, wherein the processor core is customizable;
   means for identifying an instruction set for implementing the instructions associated with the intermediate code, wherein identifying the instruction set comprises selecting individual instructions from a library of possible instructions that can be supported by the processor core; and
   means for implementing the instruction set as the supported instruction set on the processor core, wherein one or more instructions from the library of possible instructions can not be used by the processor core implemented on the programmable chip.

29. A computer readable medium comprising computer code, the computer readable medium comprising:
   computer code for identifying intermediate code, wherein the intermediate code is compiled from source code for implementing a processor core on a programmable chip, wherein the processor core is customizable;
   computer code for identifying an instruction set for implementing the instructions associated with the intermediate code, wherein identifying the instruction set comprises selecting individual instructions from a library of possible instructions that can be supported by the processor core; and
   computer code for implementing the instruction set as the supported instruction set on the processor core, wherein one or more instructions from the library of possible instructions can not be used by the processor core implemented on the programmable chip.

* * * * *